United States Patent
Suh et al.

(10) Patent No.: US 9,459,414 B2
(45) Date of Patent: Oct. 4, 2016

(54) OPTICAL COUPLING SYSTEM AND OPTICAL SENSOR INCLUDING THE SAME

(71) Applicant: Samsung Electronics Co., Ltd, Suwon-si, Gyeonggi-do (KR)

(72) Inventors: Sung-Dong Suh, Seoul (KR); Kyoung-Won Na, Seoul (KR); Yoon-Dong Park, Osan-si (KR); Beom-Suk Lee, Yongin-si (KR); Dong-Mo Im, Jindo-gun (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/163,355

(22) Filed: Jan. 24, 2014

(65) Prior Publication Data

US 2014/0209929 A1    Jul. 31, 2014

(30) Foreign Application Priority Data

Jan. 25, 2013    (KR) .................. 10-2013-0008327

(51) Int. Cl.
*G02B 6/32* (2006.01)
*G02B 6/42* (2006.01)
*H01L 31/167* (2006.01)

(52) U.S. Cl.
CPC .......... *G02B 6/4206* (2013.01); *H01L 31/167* (2013.01)

(58) Field of Classification Search
CPC ........................ G02B 6/4206; H01L 31/167
USPC ............... 385/14–15, 27, 31, 33, 37, 43
See application file for complete search history.

(56) References Cited

U.S. PATENT DOCUMENTS

| | | | | |
|---|---|---|---|---|
| 5,128,915 | A * | 7/1992 | Yamashita | G02B 6/34 369/44.12 |
| 6,594,430 | B1 * | 7/2003 | Rausch | G02B 3/04 359/717 |
| 6,658,037 | B2 * | 12/2003 | Kahen | H01S 3/0915 372/39 |
| 6,813,419 | B2 * | 11/2004 | Matsushima | G02B 6/10 385/124 |
| 6,934,444 | B2 | 8/2005 | Ghiron et al. | |
| 7,218,809 | B2 * | 5/2007 | Zhou | G02B 6/1228 385/28 |
| 7,236,662 | B2 * | 6/2007 | Kim | B82Y 20/00 385/28 |
| 7,415,184 | B2 | 8/2008 | Ghiron et al. | |
| 7,643,719 | B1 * | 1/2010 | Zhou | G02B 3/0087 385/129 |

(Continued)

FOREIGN PATENT DOCUMENTS

| | | |
|---|---|---|
| JP | 2002-350658 | 12/2002 |
| JP | 2007-519049 | 7/2007 |

*Primary Examiner* — Ryan Lepisto
*Assistant Examiner* — Guy Anderson
(74) *Attorney, Agent, or Firm* — Muir Patent Law, PLLC (57) ABSTRACT

An optical coupling system is provided which includes a first layer structure and a second layer structure. The first layer structure includes a plurality of layers sequentially stacked on a substrate, and is configured to compresses a beam emitted from a light source along a direction substantially perpendicular to a top surface of the substrate. The second layer structure is formed on the substrate, and is configured to compresses the beam, having passed through the first layer structure, along a direction substantially parallel to the top surface of the substrate.

12 Claims, 8 Drawing Sheets

(56) References Cited

U.S. PATENT DOCUMENTS

| | | | | |
|---|---|---|---|---|
| 7,664,352 B1* | 2/2010 | Okayama | G02B 6/1228 | 385/146 |
| 7,901,870 B1* | 3/2011 | Wach | G02B 5/285 | 430/321 |
| 2002/0054738 A1* | 5/2002 | Matsushima | G02B 6/10 | 385/50 |
| 2002/0171088 A1* | 11/2002 | Kahen | H01S 3/0915 | 257/88 |
| 2003/0044118 A1* | 3/2003 | Zhou | G02B 6/1228 | 385/43 |
| 2004/0120672 A1* | 6/2004 | Chong | G02B 6/12004 | 385/129 |
| 2006/0032832 A1* | 2/2006 | Choi | G02B 6/136 | 216/24 |
| 2006/0062521 A1* | 3/2006 | Zhou | G02B 6/1228 | 385/43 |
| 2009/0046979 A1* | 2/2009 | Zhou | G02B 6/32 | 385/43 |
| 2009/0087155 A1* | 4/2009 | Watanabe | G02B 6/136 | 385/131 |
| 2009/0196546 A1* | 8/2009 | Arakawa | G02B 6/12004 | 385/14 |
| 2010/0195952 A1* | 8/2010 | Lao | B29D 11/00682 | 385/14 |
| 2011/0116741 A1 | 5/2011 | Cevini et al. | | |
| 2011/0133063 A1* | 6/2011 | Ji | G02B 6/122 | 250/227.24 |
| 2011/0150386 A1 | 6/2011 | Dupuis et al. | | |
| 2015/0277044 A1* | 10/2015 | Hatori | G02B 6/1228 | 385/43 |

* cited by examiner

OPTICAL COUPLING SYSTEM AND OPTICAL SENSOR INCLUDING THE SAME

CROSS-REFERENCE TO RELATED APPLICATIONS

This application claims the benefit of priority under 35 U.S.C. §119 to Korean Patent Application No. 10-2013-0008327, filed on Jan. 25, 2013, in the Korean Intellectual Property Office, the content of which is incorporated by reference herein in its entirety by reference.

BACKGROUND

1. Field

Example embodiments of the inventive concepts described herein relate to an optical coupling system and an optical sensor including the same.

2. Description of the Related Art

In order to couple a light emitted from a light source with a thin optical waveguide, a lens, an optical fiber, a grating coupler, etc., are needed, and these optical elements may not easily be integrated on a plane. This makes alignment of these optical elements difficult. Thus, packaging of these optical elements requires much time and costs a great deal of money. A vertical tapered waveguide may be used to integrate these optical elements on a plane. However, accurate deposition and control of a vertical tapered waveguide is not easy, and reproduction of an etching process is difficult. Thus, there is a need for an optical system that may be manufactured quickly and cheaply and may be integrated on a plane.

SUMMARY

The present general inventive concept provides an optical coupling system that may be integrated easily.

The present general inventive concept also provides an optical sensor including the optical coupling system.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing an optical coupling system including a first layer structure and a second layer structure. The first layer structure includes a plurality of layers sequentially stacked on a substrate, and configured to compress a beam emitted from a light source along a direction substantially perpendicular to a top surface of the substrate. The second layer structure is formed on the substrate, and configured to compress the beam, having passed through the first layer structure, along a direction substantially parallel to the top surface of the substrate.

In example embodiments, a vertically central layer among the plurality of layers of the first layer structure may have a highest refractive index, and other layers of the plurality of layers may have refractive indices that are progressively lower as distances of the other layers from the central layer increase.

In example embodiments, the first layer structure may include polysilicon doped with impurities. A vertically central layer among the plurality of layers of the first layer structure may have a highest doping concentration, and other layers of the plurality of layers may have doping concentrations that are progressively lower as distances of the other layers from the central layer increase.

In example embodiments, the second layer structure may include a lens portion convex against a direction from the light source to the first layer structure, and a tapered portion may be integrally formed with the lens portion. The tapered portion may have a width that decreases in the direction from the light source to the first layer structure.

In example embodiments, the second layer structure may include at least one of single crystalline silicon, polysilicon, and silicon nitride.

In example embodiments, the light source may be a laser diode (LD) or an amplified spontaneous emission (ASE).

In an example embodiment, the first layer structure may have a length along a direction from the first layer structure to the second layer structure substantially equal to an integer multiple of a ¼ pitch of the beam so that the beam has a most narrow width in the direction substantially perpendicular to the top surface of the substrate at a plane.

In an example embodiment, the first layer structure may have a length along a direction from the first layer structure to the second layer structure less than an integer multiple of a ¼ pitch of the beam so that the beam has a most narrow width in the direction substantially perpendicular to the top surface of the substrate at a plane coincidental with a point between the first layer structure and the second layer structure.

The foregoing and/or other features and utilities of the present inventive concept may also be achieved by providing an optical sensor including a light source on a substrate, a first layer structure, a second layer structure, a light waveguide configured to pass a beam having passed through the second layer structure, a light receiving element configured to receive the beam, having passed through the light waveguide, and to convert the beam into an electrical signal, and a signal processor configured to process the electrical signal. The first layer structure includes a plurality of layers sequentially stacked on the substrate, and configured to compress the beam emitted from the light source along a direction substantially perpendicular to a top surface of the substrate. The second layer structure is formed on the substrate, and configured to compress the beam, having passed through the first layer structure, along a direction substantially parallel to the top surface of the substrate.

In an embodiment, a vertically central layer among the plurality of layers of the first layer structure may have a highest refractive index, and other layers of the plurality of layers may have refractive indexes that are progressively lower as distances of the other layers from the central layer increase.

In an embodiment, the first layer structure may include polysilicon doped with impurities. A vertically central layer among the plurality of layers of the first layer structure may have a highest doping concentration, and other layers of the plurality of layers may have doping concentrations that are progressively lower as distances of the other layers from the central layer increase.

In an embodiment, the second layer structure may include a lens portion convex against a direction from the light source to the first layer structure, and a tapered portion may be integrally formed with the lens portion. The tapered portion may have a width that decreases in the direction from the light source to the first layer structure.

In an embodiment, the light waveguide may be formed on the substrate, and the second layer structure and the light waveguide may be integrally formed.

In an embodiment, the light receiving element may be a photodiode (PD).

In an embodiment, the optical sensor may further include a fluid conduit configured to receive a test sample. The fluid conduit may be in contact with the light waveguide.

In an embodiment, the fluid conduit may include a gold nano-particle fixed to a bio-antibody.

The foregoing and/or other features and utilities of the present inventive concept may be achieved by providing an optical sensor including a light source on a substrate, a first layer structure, a second layer structure, a light waveguide configured to pass a beam having passed through the second layer structure, a fluid conduit configured to receive a test sample and to generate a light signal, and a light detector configured to detect the light signal. The first layer structure includes a plurality of layers sequentially stacked on the substrate, and configured to compress the beam emitted from the light source along a direction substantially perpendicular to a top surface of the substrate. The second layer structure is formed on the substrate, and is configured to compress the beam, having passed through the first layer structure, along a direction substantially parallel to the top surface of the substrate. The fluid conduit is in contact with the light waveguide.

In an embodiment, a vertically central layer among the plurality of layers of the first layer structure may have a highest refractive index, and other layers of the plurality of layers may have refractive indexes that are progressively lower as distances of the other layers from the central layer increase. The second layer structure may include a lens portion convex against a direction from the light source to the first layer structure, and a tapered portion integrally formed with the lens portion. The tapered portion may have a width that decreases in the direction from the light source to the first layer structure.

In an embodiment, the fluid conduit may have a cylindrical shape, may be hollow, and may have a thickness in a range from about 10 microns to about 1,000 microns.

In an embodiment, a bio-antibody may be fixed to an inner wall of the fluid conduit.

In an embodiment, the beam emitted from the light source may have a cross-section of a desired small size and shape when the beam passes through the optical coupling system that includes the first and second layer structures. Thus, the beam may be well coupled well to the light waveguide connected to the light receiving element.

In an embodiment, the optical coupling system may be disposed on the substrate along with the light source configured to provide light for the optical coupling system, the light waveguide onto which the light, having passed through the optical coupling system, is incident, and the light receiving element. Thus, these elements may be integrated on the substrate so that the time and/or cost for fabrication thereof may be reduced.

The foregoing and/or other features and utilities of the present general inventive concept may be achieved by providing optical coupling system including a layer structure system formed on a substrate and configured first to compress a beam emitted from a light source along a direction substantially perpendicular to a top surface of the substrate and then to compress the beam along a direction substantially parallel to the top surface of the substrate.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
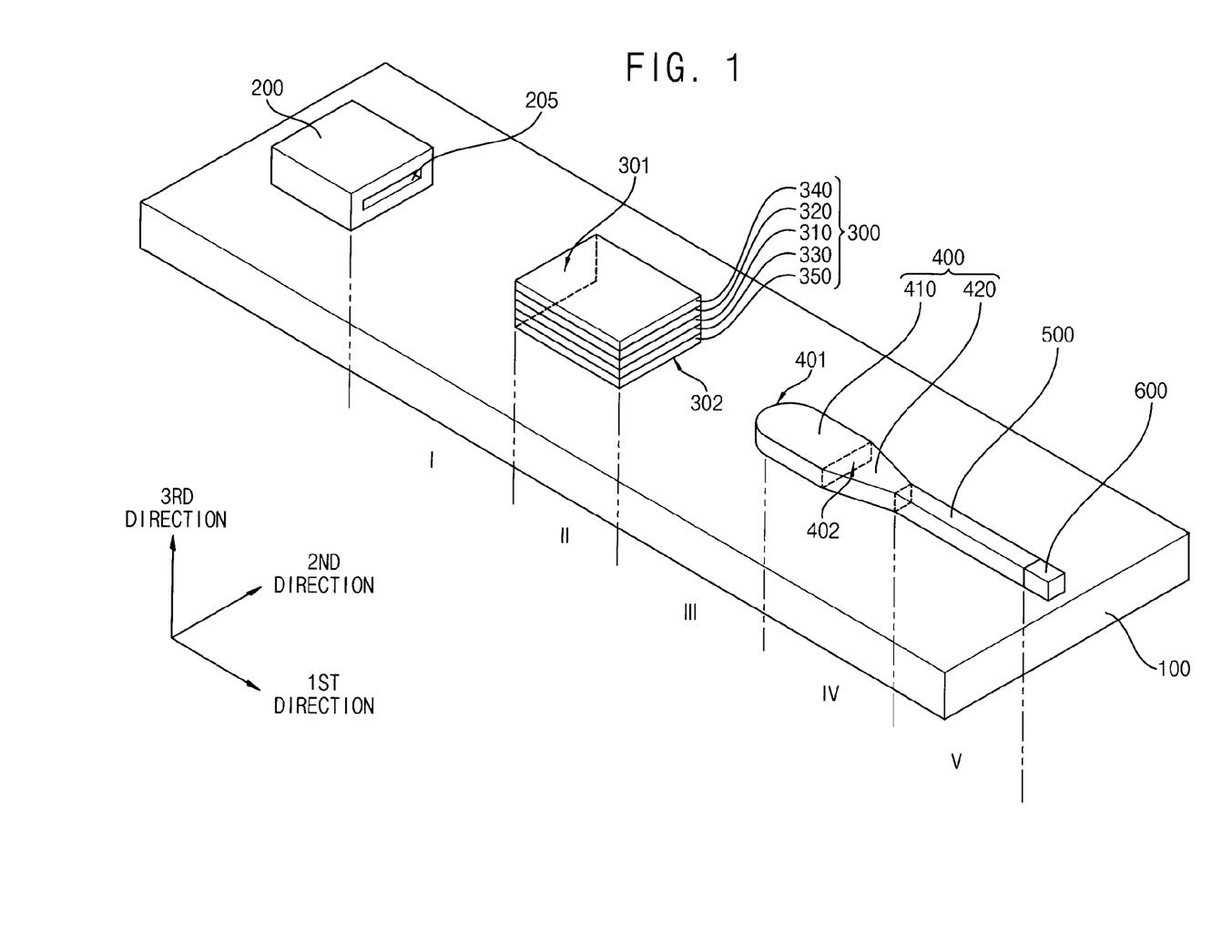
FIG. 1 is a perspective view illustrating an optical coupling system according to an embodiment of the present inventive concept.

FIG. 1 is a perspective view that illustrates an optical coupling system according to an example embodiment of the present inventive concept.

Referring to FIG. 1, the optical coupling system may include a first layer structure 300 and a second layer structure 400 on a substrate 100.

The substrate 100 may include a semiconductor material, e.g., silicon, germanium, etc., or an insulating material, e.g., glass, plastic, etc.

The first layer structure 300 may include a plurality of layers 350, 330, 310, 320 and 340 sequentially stacked on the substrate 100.

In example embodiments, a first layer 310 may be disposed at a vertically central portion among the plurality of layers 350, 330, 310, 320 and 340 may have a highest refractive index, and the other layers, i.e., a second, a third, a fourth and a fifth layers 320, 330, 340 and 350 may have refractive indices that may be progressively lower as their distances from the first layer 310 increase. For example, the first to fifth layers 310, 320, 330, 340 and 350 may have first to fifth refractive indices, respectively, and the first refractive index may be the highest, the second and third refractive indices may be substantially the same and in the middle, and the fourth and fifth refractive indices may be substantially the same and the lowest. As illustrated in FIG. 1, the first layer structure 300 includes, for example, the five layers 310, 320, 330, 340 and 350. However, the number of the layers included in the first layer structure 300 may not be limited thereto.

The first layer structure 300 may include, e.g., doped polysilicon. The first layer 310 may have a highest doping concentration, and the other layers, i.e., the second, the third, the fourth and the fifth layers 320, 330, 340 and 350 may have doping concentrations that may be progressively lower as their distances from the first layer 310 increase. For example, the first to fifth layers 310, 320, 330, 340 and 350 may have first to fifth doping concentrations, respectively, and the first doping concentration may be the highest, the second and third doping concentrations may be substantially the same and in the middle, and the fourth and fifth doping concentrations may be substantially the same and the lowest.

The first layer structure 300 may have a first surface 301 substantially perpendicular to a top surface of the substrate 100 and a second surface 302 opposite to the first surface 301 thereof. The first layer structure 300 may be configured to compress a beam incident onto the first surface 301 thereof in a first direction, which may be substantially perpendicular to the first surface 301, which lies along a third direction substantially perpendicular to the top surface of the substrate 100. Thus, a beam emitted from the second surface 302 of the first layer structure 300 may have a compressed shape along the third direction, i.e., along the vertical direction, when compared to the beam incident onto the first surface 301 of the first layer structure 300.

The second layer structure 400 may be disposed on the substrate 100 to be spaced apart from the first layer structure 300, and may include a lens portion 410 and a tapered portion 420.

The lens portion 410 may include a first surface 401 and a second surface 402 opposite to the first surface 401. The first surface 401 of the lens portion 410 may have a convex curved surface, e.g., a convex lens shape against a direction in which a beam may propagate, i.e., against the first direction, and the second surface 402 of the lens portion 410 may be a flat plane substantially perpendicular to the top surface of the substrate 100.

A beam incident onto the first surface 401 of the lens portion 410 in the first direction may be refracted in accordance with a curvature of the first surface 401 of the lens portion 410 to be compressed along a second direction, which may be substantially parallel to the top surface of the substrate 100 and substantially perpendicular to the first direction. Thus, a beam emitted through the second surface 402 of the lens portion 410 in the first direction may have a compressed shape along the second direction, i.e., along the horizontal direction substantially perpendicular to a beam propagation direction.

The tapered portion 420 may contact the second surface 402 of the lens portion 410. The tapered portion 420 may have a width along the second direction that may decrease in the first direction. Thus, a beam emitted from the second surface 402 of the lens portion 410 may have a first width along the second direction that may decrease or remain constant in the tapered portion 420.

In an example embodiment, the lens portion 410 and the tapered portion 420 may be integrally formed on the substrate 100, and the second layer structure 400, including the lens portion 410 and the tapered portion 420, may include, e.g., single crystalline silicon, polysilicon, silicon nitride, etc.

The above-illustrated optical coupling system may change a shape of a beam emitted from a light source 200 on the substrate 100, when the emitted beam propagates toward a light receiving element 600 on the substrate 100, so that the shape of the beam may correspond to a shape of a light waveguide 500 connected to the light receiving element 600. Thus, the beam may be well coupled to the light waveguide 500, which may be illustrated in greater detail with reference to FIGS. 2 to 4.

Figure 2:
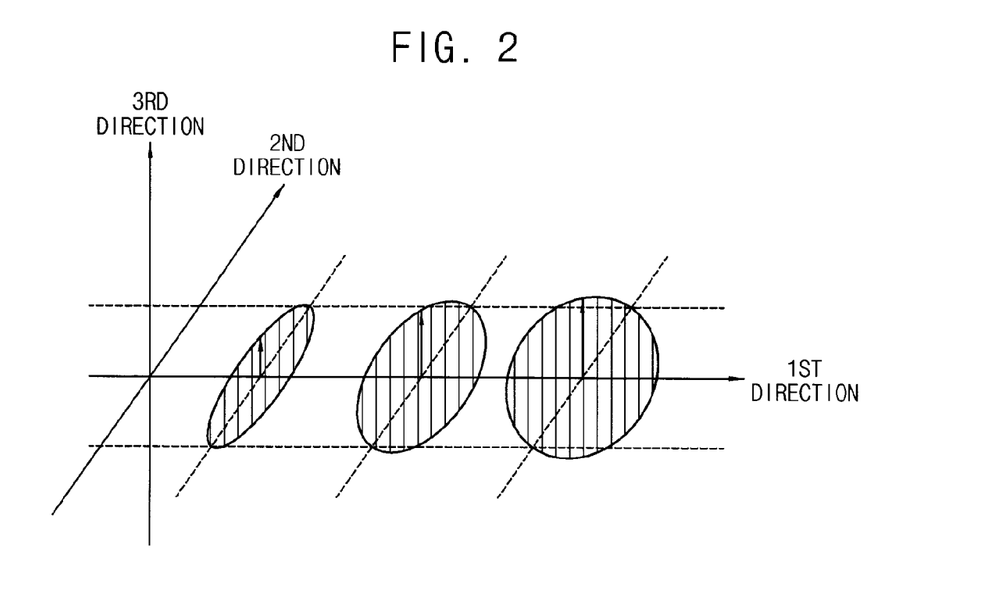
FIGS. 2 to 4 are beam shape diagrams illustrating shape changes of a beam that may be emitted from a light source and propagated toward a light receiving element, according to an embodiment of the present inventive concept.
Figure 3:
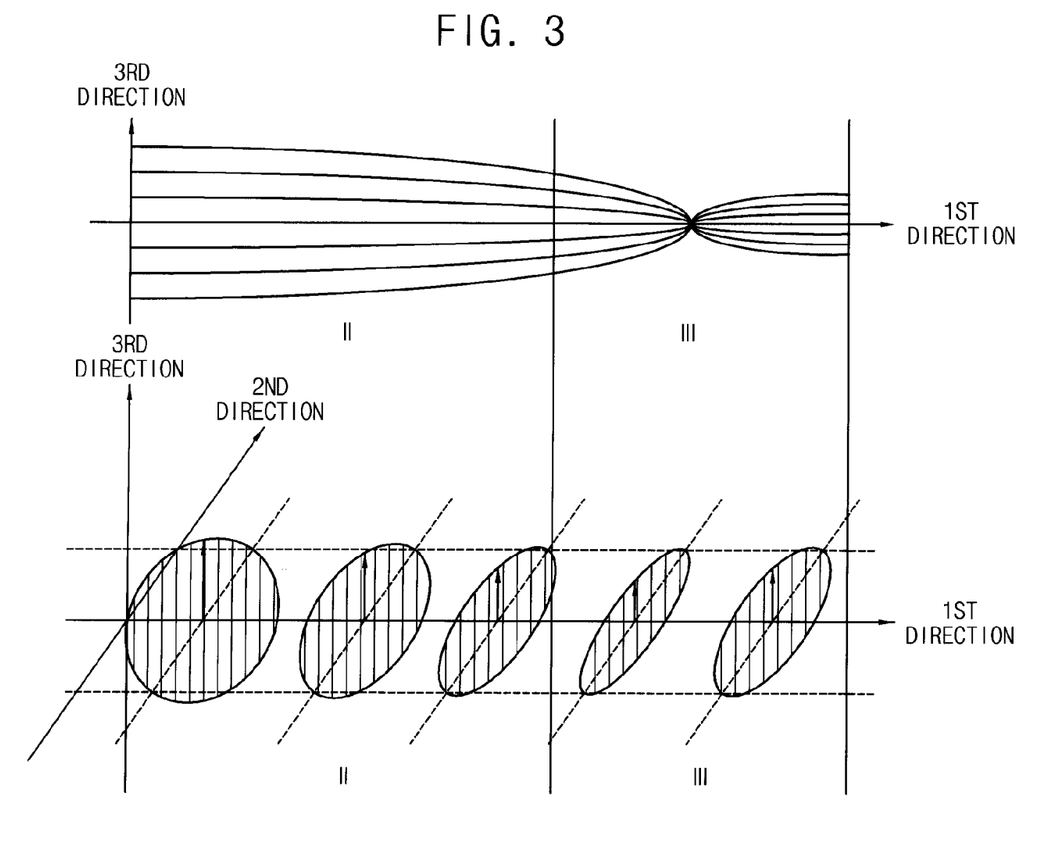
Figure 4:
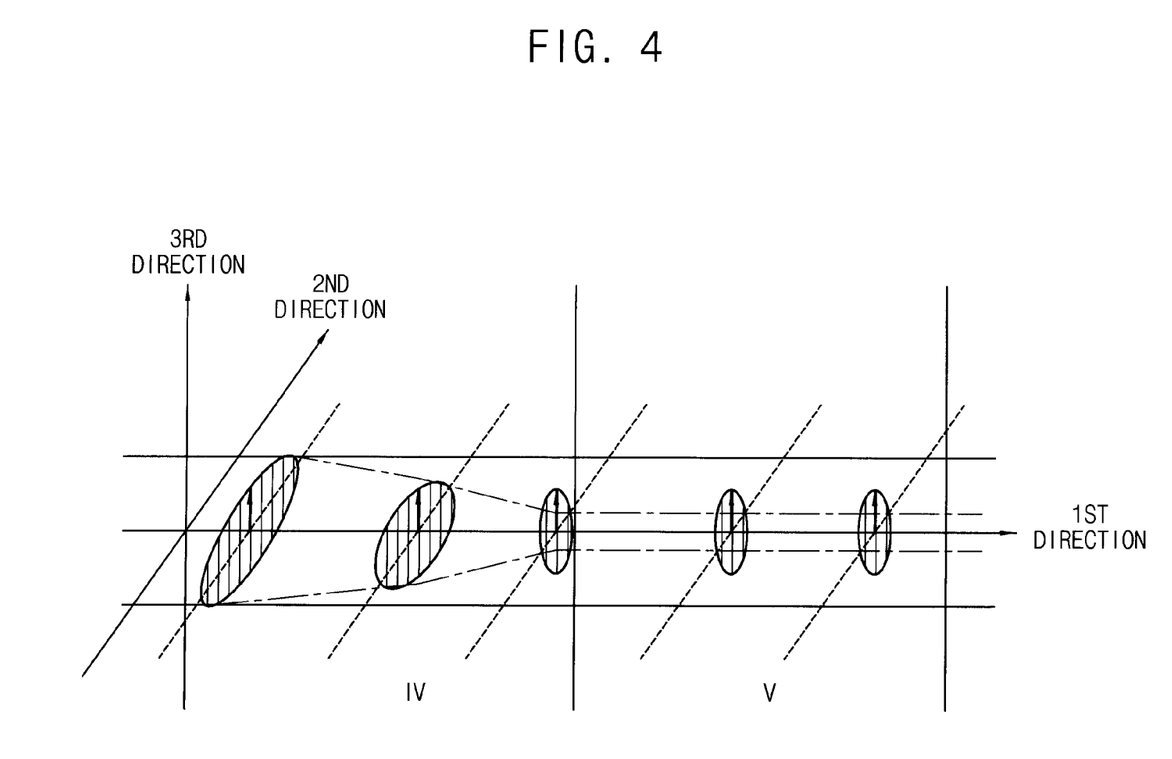

FIGS. 2 to 4 are beam shape diagrams that illustrate shape changes of a beam that may be emitted from the light source 200 and propagated toward the light receiving element 600, according to an embodiment of the present inventive concept. Particularly, FIG. 2 illustrates a cross-sectional view of the beam in a first region I (see FIG. 1) between the light source 200 and the first layer structure 300, FIG. 3 illustrates a cross-sectional view of the beam in a second region II (see FIG. 1) in the first layer structure 300 and in a third region III (see FIG. 1) between the first layer structure 300 and the second layer structure 400, and FIG. 4 illustrates a cross-sectional view of the beam in a fourth region IV (see FIG. 1) in the second layer structure 400 and in a fifth region V (see FIG. 1) in the light waveguide 500, which may be disposed between the second layer structure 400 and the light receiving element 600. FIG. 3 also illustrates a shape of the light refracted in the first layer structure 300.

Referring to FIGS. 1 and 2, a beam emitted from the light source 200 on the substrate 100 may propagate in the first direction, and a second width of the beam along the third direction may increase while the beam propagates in the first direction.

In an embodiment, the light source 200 may include, for example, a laser diode (LD) or an amplified spontaneous emission (ASE).

The beam emitted from a cavity 205 of the light source 200 may have a shape similar to that of the cavity 205 when the beam is near the cavity 205. However, the shape of the beam may change as the beam propagates in the first direction increasingly more distant from the cavity 205. That is, according to diffraction theory, a first width of the beam along the second direction may remain constant while a second width of the beam along the third direction may increase as the beam propagates in the first direction.

Referring to FIGS. 1 and 3, the shape of the beam may change when the beam passes through the first layer structure 300. That is, the second width of the beam along the third direction may decrease when the beam passes through the first layer structure 300, which includes the first to fifth layers 310, 320, 330, 340 and 350, among which the central first layer 310 may have the highest refractive index.

In example embodiments, the first layer structure 300 may have a length along the first direction that may be substantially an integer multiple of a ¼ pitch of the beam. The beam may focus at each ¼ pitch in the first layer structure 300, i.e., the beam may have a most narrow second width along the third direction at each ¼ pitch in the first layer structure 300. Thus, the beam, having passed through the first layer structure 300, may have a most narrow second width along the third direction when the beam is emitted from the first layer structure 300.

In this case, the first layer structure 300 may not have a length along the first direction that may be exactly an integer multiple of a ¼ pitch of the beam, but may have a length along the first direction that may be approximately an integer multiple of a ¼ pitch of the beam. In an example embodiment, the first layer structure 300 may have a length along the first direction that may be a little shorter than an integer multiple of a ¼ pitch of the beam, and thus the second width along the third direction may be at a most narrow point between the first layer structure 300 and the second layer structure 400, i.e., in the third region III. Thus, the second width along the third direction of the beam may have increased a little when the beam, having passed through the first layer structure 300, enters the second layer structure 400.

Referring to FIGS. 1 and 4, the shape of the beam may change again when the beam passes through the second layer structure 400. That is, the first width of the beam along the second direction may decrease when the beam passes through the second layer structure 400, which includes the lens portion 410, which may have the first surface 401 with a convex lens shape, and the tapered portion 420 having a width along the second direction that may decrease in the first direction.

Accordingly, a beam incident onto the light waveguide 500 connected to the tapered portion 420 of the second layer structure 400 may have the first and second widths along the second and third directions, respectively, which may be decreased to a desired level. That is, the beam emitted from the light source 200 may have a cross-section with a desired small size and shape after the beam has passed through the optical coupling system, which includes the first and second layer structures 300 and 400. Thus, the beam may be well coupled to the light waveguide 500 connected to the light receiving element 600.

Additionally, the optical coupling system may be disposed on the substrate 100 along with the light source 200 configured to provide light for the optical coupling system, the light waveguide 500 onto which the light, having passed through the optical coupling system, is incident, and the light receiving element 600. Thus, these elements may be integrated on the substrate 100 so that the time and/or cost for fabrication thereof may be reduced.

Figure 5:
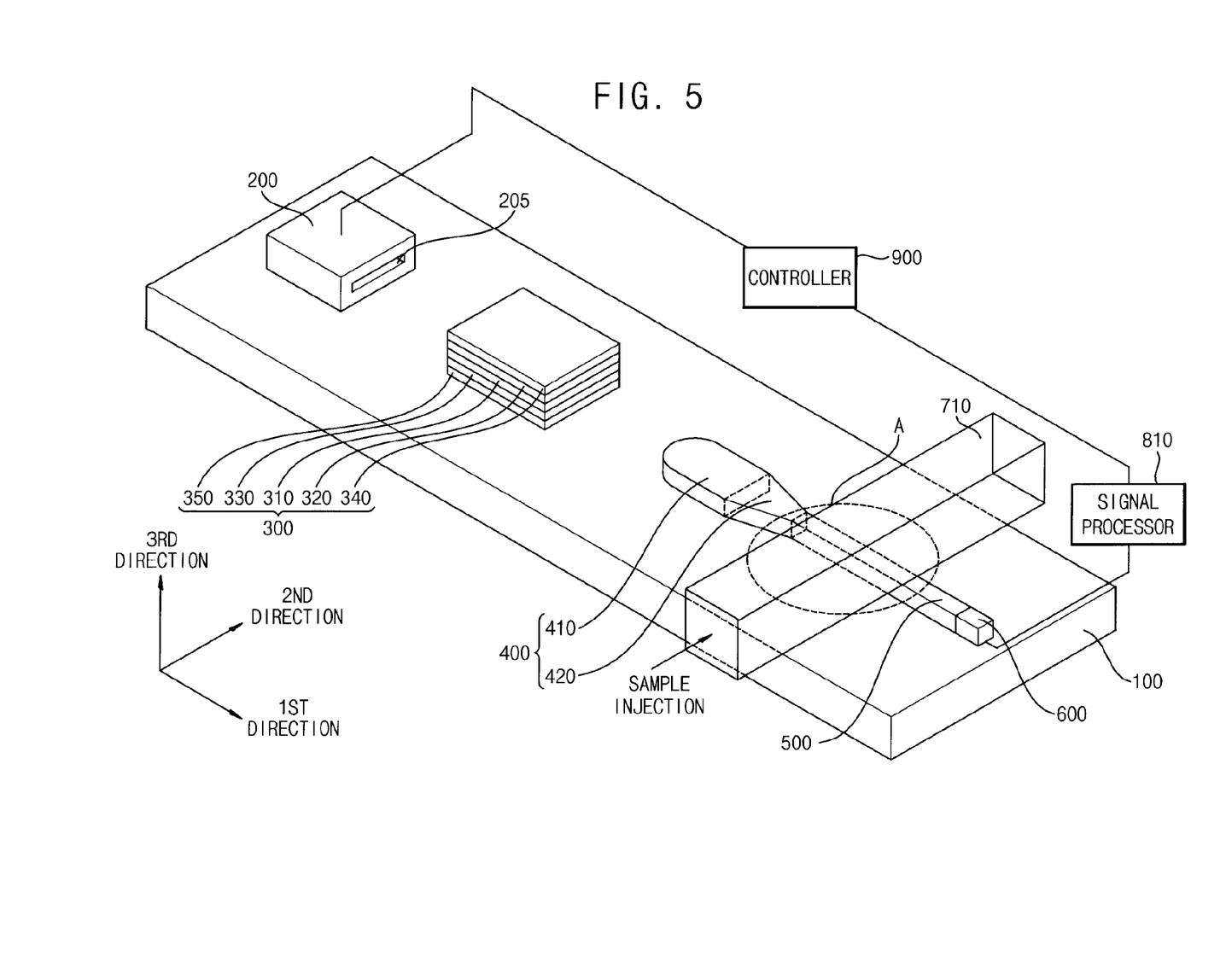
FIG. 5 is a perspective view illustrating an optical sensor according to an embodiment of the present inventive concept.
Figure 6:
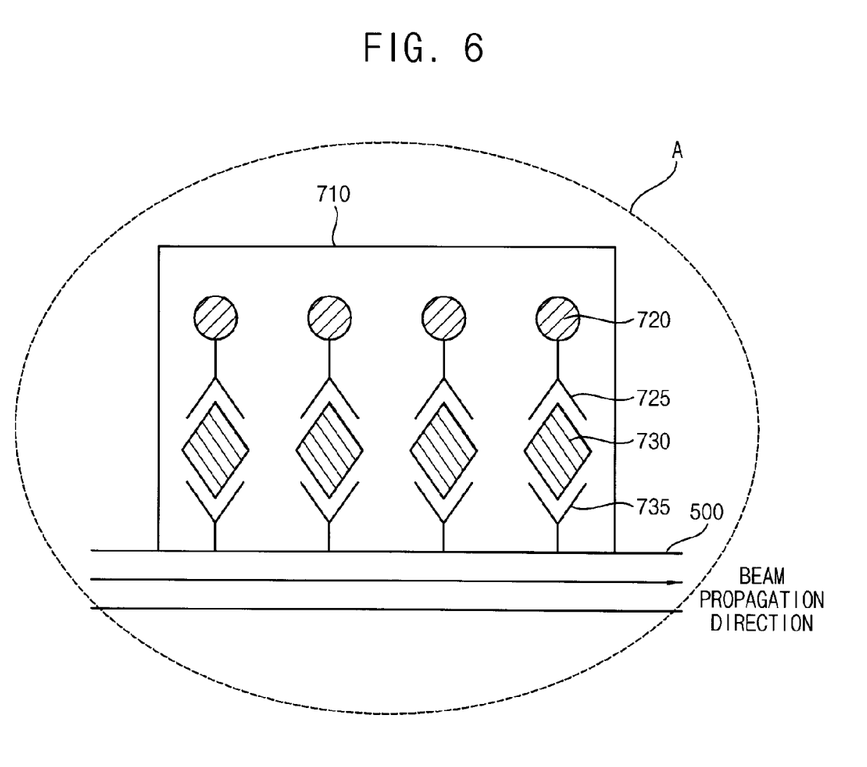
FIG. 6 is a cross-sectional view illustrating a first fluid conduit in a region A of the optical sensor illustrated in FIG. 5.

FIG. 5 is a perspective view that illustrates an optical sensor according to an example embodiment of the present inventive concept, and FIG. 6 is a cross-sectional view that illustrates a first fluid conduit in a region A of the optical sensor illustrated in FIG. 5. The optical sensor may include a structure substantially the same as or similar to the optical coupling system illustrated with reference to FIG. 1, and thus like reference numerals refer to like elements, and detailed explanations thereon are omitted herein. FIGS. 5 and 6 illustrate an optical biosensor. However, the present inventive concept may not be limited thereto.

Referring to FIGS. 5 and 6, the optical sensor may include the light source 200, the first and second layer structures 300 and 400, the light waveguide 500 and the light receiving element 600 on the substrate 100, a signal processor 810 configured to process electrical signals generated by the light receiving element 600, and a controller 900 configured to control the light source 200 and the signal processor 810. The optical sensor may further include a first fluid conduit 710 into which a sample may be injected.

The light source 200 may include, for example, a laser diode (LD) or an amplified spontaneous emission (ASE). The first layer structure 300 may be configured to compress, along a third direction substantially perpendicular to the top surface of the substrate 100, a beam, which may be emitted from the light source 200 and propagated in a first direction substantially parallel to a top surface of the substrate 100. The first layer structure 300 may include a plurality of layers 310, 320, 330, 340 and 350, which may be sequentially stacked on the substrate 100. The second layer structure 400 may compress the beam, having passed through the first layer structure 300, along a second direction substantially parallel to the top surface of the substrate 100 and substantially perpendicular to the first direction. The light waveguide 500 may be integrally formed together with the second layer structure 400, and the beam, having passed through the second layer structure 400, may be coupled with the light waveguide 500 and pass there through. The light receiving element 600 may be configured to receive the beam, having passed through the light waveguide 500, and to convert the received beam into electrical signals. In an embodiment, the light receiving element 600 may be, for example, a photodiode (PD).

In an embodiment, the first fluid conduit 710 may be, for example, a microfluidic channel that includes a gold nano-particle 720 (see FIG. 6) to which a first bio-antibody 725 (see FIG. 6) may be fixed. A second bio-antibody 735 (see FIG. 6) may be fixed on an outer wall of the light waveguide 500 contacting the first fluid conduit 710.

A test sample, e.g., blood, urine, saliva, etc., may flow in the first fluid conduit 710, and a first bio-antigen 730 included in the test sample may be combined between the first and second bio-antibodies 725 and 735.

The optical sensor may work as follows.

A beam may be emitted from the light source 200 and may be controlled by the controller 900, and the emitted beam may pass through the first and second layer structures 300 and 400 and may be coupled with the light waveguide 500. The beam, having passed through the light waveguide 500, may be incident onto the light receiving element 600, and a light signal within the beam may be converted into an electrical signal, e.g., current. The converted electrical signal may be processed by the signal processor, which may be controlled by the controller 900.

A test sample may flow through the first fluid conduit 710, and the first bio-antigen 730 included in the test sample may be combined between the first and second bio-antibodies 725 and 735 that may be fixed to the gold nano-particle 720 in the first fluid conduit 710 and to the outer wall of the light waveguide 500, respectively. This may cause a degree of light absorption by the gold nano-particle 720 in the first fluid conduit 710 to be changed, which may have an influence on the beam passing through the light waveguide 500, which may cause the electrical signal, e.g., current generated by the light receiving element 600, to change. The electrical signal may be processed by the signal processor 810.

A difference in the electrical signals before and after the test sample flows through the first fluid conduit 710 may be compared to each other so that a concentration of the first bio-antigen 730 included in the test sample may be measured, and the optical sensor may work in this way.

Figure 7:
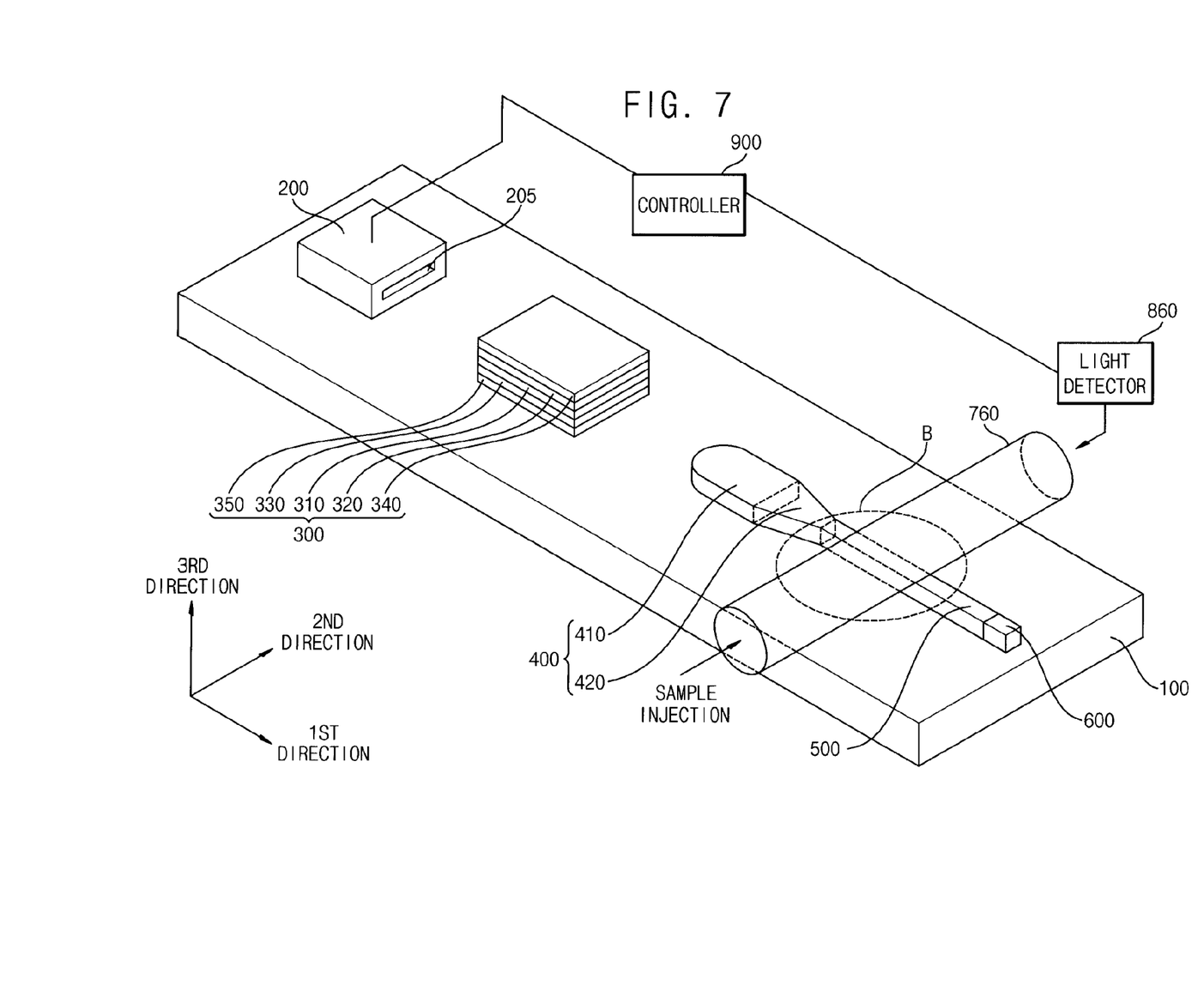
FIG. 7 is a perspective view illustrating an optical sensor according to an embodiment of the present inventive concept.
Figure 8:
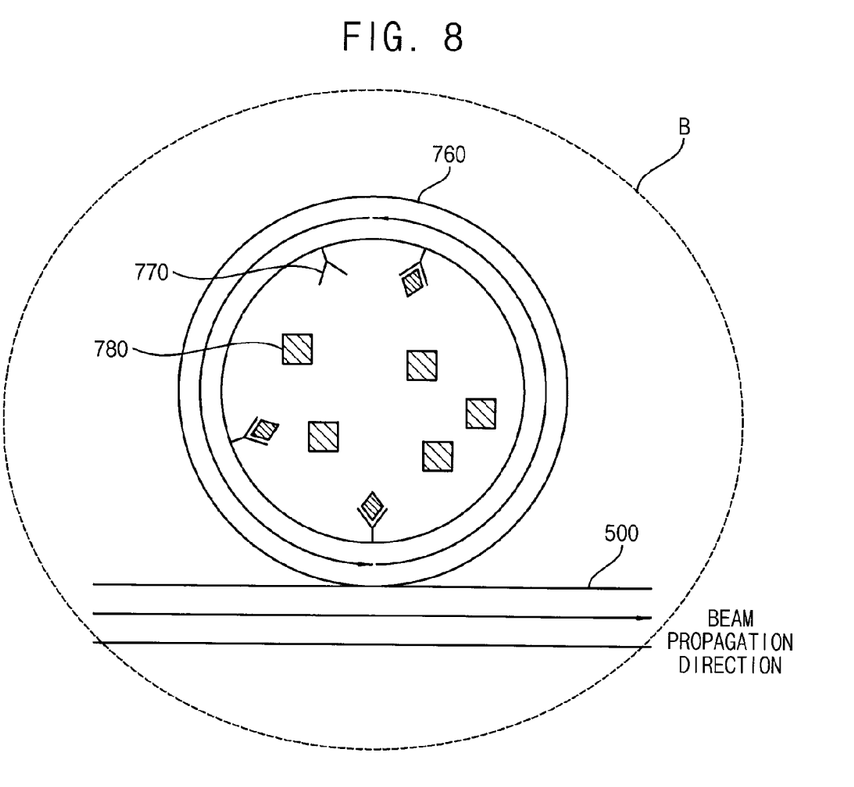
FIG. 8 is a cross-sectional view illustrating a second fluid conduit in a region B of the optical sensor illustrated in FIG. 7.

FIG. 7 is a perspective view that illustrates an optical sensor according to an embodiment of the present inventive concept, and FIG. 8 is a cross-sectional view that illustrates a second fluid conduit in a region B of the optical sensor illustrated in FIG. 7. The optical sensor may include a structure substantially the same as or similar to the optical sensor illustrated with reference to FIGS. 5 and 6, and thus like reference numerals refer to like elements, and detailed explanations thereon are omitted herein.

Referring to FIGS. 7 and 8, the optical sensor may include the light source 200, the first and second layer structures 300 and 400 and the light waveguide 500 on the substrate 100, a second fluid conduit 760 into which a test sample may be injected, a light detector 860 configured to detect light emitted from the second fluid conduit 760, and the controller 900 configured to control the light source 200 and the light detector 860. The optical sensor may further include the light receiving element 600 connected to the light waveguide 500.

In an embodiment, the second fluid conduit 760 may be, for example, a micro-tubule that has a hollow cylindrical shape and a thickness, for example, from about 10 to about 1,000 μm. A third bio-antibody 770 (see FIG. 8) may be fixed on an inner wall of the second fluid conduit 760.

A test sample, e.g., blood, urine, saliva, etc., may flow in a space surrounded by the inner wall of the second fluid conduit 760, and a second bio-antigen 780 (see FIG. 8) included in the test sample may be combined with the third bio-antibody 770.

The optical sensor may work as follows.

A beam may be emitted from the light source 200 and may be controlled by the controller 900, and the emitted beam may pass through the first and second layer structures 300 and 400 and may be coupled with the light waveguide 500. The beam, having passed through the light waveguide 500, may be incident onto the light receiving element 600. As the beam passes through the light waveguide 500, a ring vibrator (not shown) may be generated in the second fluid conduit 760, which may contact the light waveguide 500, and a light signal, e.g., a light spectrum, may be emitted therefrom. The light signal may be detected by the light detector 860, which may be controlled by the controller 900.

A test sample may flow through the space surrounded by the inner wall of the second fluid conduit 760, and the second bio-antigen 780 included in the test sample may be combined with the second bio-antibody 770 on the inner wall of the second fluid conduit 760. This may cause the light signal, e.g., the light spectrum, generated by the ring vibrator (not shown) in the second fluid conduit 760 to change. The light signal may be detected by the light detector 860.

A difference in the light signals before and after the test sample flows through the space surrounded by the inner wall of the second fluid conduit 760 may be compared to each other so that a concentration of the second bio-antigen 780 included in the test sample may be measured, and the optical sensor may work in this way.

As illustrated above, the optical coupling system may be applied to various types of optical sensors, e.g., bio-sensors.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An optical sensor, comprising:
   a light source on a substrate;
   a first layer structure including a plurality of layers sequentially stacked on the substrate, the first layer structure configured to compress a beam emitted from the light source along a direction substantially perpendicular to a top surface of the substrate;

a second layer structure on the substrate, the second layer structure configured to compress the beam, having passed through the first layer structure, along a direction substantially parallel to the top surface of the substrate;

a light waveguide configured to pass the beam having passed through the second layer structure;

a light receiving element configured to receive the beam, having passed through the light waveguide, and to convert the beam into an electrical signal; and a signal processor configured to process the electrical signal.

2. The optical sensor of claim 1, wherein a vertically central layer among the plurality of layers of the first layer structure has a highest refractive index, and other layers of the plurality of layers have refractive indices that are progressively lower as distances of the other layers from the central layer increase.

3. The optical sensor of claim 1, wherein the first layer structure includes polysilicon doped with impurities, and wherein a vertically central layer among the plurality of layers of the first layer structure has a highest doping concentration, and other layers of the plurality of layers have doping concentrations that are progressively lower as distances of the other layers from the central layer increase.

4. The optical sensor of claim 1, wherein the second layer structure includes: a lens portion convex against a direction from the light source to the first layer structure; and a tapered portion integrally formed with the lens portion, the tapered portion having a width that decreases in the direction from the light source to the first layer structure.

5. The optical sensor of claim 1, wherein the light waveguide is formed on the substrate, and the second layer structure and the light waveguide are integrally formed.

6. The optical sensor of claim 1, wherein the light receiving element is a photodiode (PD).

7. The optical sensor of claim 1, further comprising a fluid conduit configured to receive a test sample, the fluid conduit in contact with the light waveguide.

8. The optical sensor of claim 7, wherein the fluid conduit includes a gold nano-particle fixed to a bio-antibody.

9. An optical sensor, comprising:

a light source on a substrate;

a first layer structure including a plurality of layers sequentially stacked on the substrate, the first layer structure configured to compress a beam emitted from the light source along a direction substantially perpendicular to a top surface of the substrate;

a second layer structure on the substrate, the second layer structure configured to compress the beam, having passed through the first layer structure, along a direction substantially parallel to the top surface of the substrate;

a light waveguide configured to pass the beam having passed through the second layer structure;

a fluid conduit configured to receive a test sample and to generate a light signal, the fluid conduit in contact with the light waveguide; and a light detector configured to detect the light signal.

10. The optical sensor of claim 9, wherein a vertically central layer among the plurality of layers of the first layer structure has a highest refractive index, and other layers of the plurality of layers have refractive indices that are progressively lower as distances of the other layers from the central layer increase, and wherein the second layer structure includes: a lens portion convex against a direction from the light source to the first layer structure; and a tapered portion integrally formed with the lens portion, the tapered portion having a width that decreases in the direction from the light source to the first layer structure.

11. The optical sensor of claim 9, wherein the fluid conduit has a cylindrical shape, is hollow, and has a thickness in a range from 10 microns to 1,000 microns.

12. The optical sensor of claim 11, wherein a bio-antibody is fixed to an inner wall of the fluid conduit.

* * * * *